United States Patent
Ray et al.

(10) Patent No.: US 7,175,969 B1
(45) Date of Patent: Feb. 13, 2007

(54) METHOD OF PREPARING NEGATIVE-WORKING RADIATION-SENSITIVE ELEMENTS

(75) Inventors: Kevin B. Ray, Fort Collins, CO (US); Heidi M. Munnelly, Windsor, CO (US); Ting Tao, Fort Collins, CO (US); Kevin D. Wieland, Greeley, CO (US); Scott A. Beckley, Windsor, CO (US); Jianbing Huang, Trumbull, CT (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/488,588

(22) Filed: Jul. 18, 2006

(51) Int. Cl.
*G03F 7/028* (2006.01)
*G03F 7/033* (2006.01)
*G03F 7/034* (2006.01)
*G03F 7/085* (2006.01)
*G03F 7/14* (2006.01)

(52) U.S. Cl. .................. 430/278.1; 430/14; 430/281.1; 430/905; 430/909; 430/964; 430/302

(58) Field of Classification Search ............. 430/278.1, 430/281.1, 302, 14, 905, 909, 964
See application file for complete search history.

(56) References Cited

U.S. PATENT DOCUMENTS

| 6,376,057 | B1 | 4/2002 | Akao et al. |
| 6,461,795 | B1 * | 10/2002 | McCullough et al. ....... 430/302 |
| 6,551,696 | B2 | 4/2003 | Usui |
| 6,596,457 | B1 | 7/2003 | Hidaka et al. |
| 6,706,466 | B1 | 3/2004 | Lott et al. |
| 6,899,994 | B2 * | 5/2005 | Huang et al. ............ 430/271.1 |

FOREIGN PATENT DOCUMENTS

| EP | 634697 A1 | 1/1995 |
| EP | 1076013 A1 | 3/2006 |
| JP | 2005/254537 | 9/2005 |
| WO | WO99/21715 | 5/1999 |

OTHER PUBLICATIONS

U.S. Appl. No. 11/366,076 filed Mar. 2, 2006, titled *Heat Treatment Of Multilayer Imageable Elements*, by Mulligan, Clark & Ray.

* cited by examiner

*Primary Examiner*—Richard L. Schilling
(74) *Attorney, Agent, or Firm*—J. Lanny Tucker

(57) ABSTRACT

A method of preparing negative-working, single-layer imageable elements improves their storage stability in a humid environment. The method includes enclosing the coated imageable elements in a water-impermeable sheet material that substantially inhibits the transfer of moisture to and from the imageable element. Such imageable elements include a radiation-sensitive composition that includes a radically polymerizable component, an initiator composition to provide radicals upon exposure to imaging radiation, a radiation absorbing compound, and a polymeric binder having poly(alkylene glycol) side chains.

24 Claims, No Drawings

METHOD OF PREPARING NEGATIVE-WORKING RADIATION-SENSITIVE ELEMENTS

FIELD OF THE INVENTION

This invention relates to a method of improving the developability and storage stability of negative-working imageable elements, such as negative-working lithographic printing plate precursors, in a humid environment. The invention also relates to methods of using these improved imageable elements.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of from about 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and non-exposed regions are washed off during development. For positive-working printing plates, the exposed regions are dissolved in a developer and the non-exposed regions remain on the substrate.

Various radiation compositions and imageable elements containing reactive polymer binders are described in U.S. Pat. No. 6,569,603 (Furukawa) and EP 1,182,033A1 (Fujimaki et al.). Other IR-sensitive compositions are described in U.S. Pat. No. 6,309,792 (Hauck et al.), U.S. Pat. No. 6,893,797 (Munnelly et al.), U.S. Pat. No. 6,787,281 (Tao et al.), and U.S. Pat. No. 6,899,994 (Huang et al.), U.S. Patent Application Publication 2003/0118939 (West et al.), and EP 1,079,276A1 (Lifka et al.) and EP 1,449,650A1 (Goto).

Wrapping and conditioning (heat-treatment) of multilayer positive-working imageable elements has been carried out to reduce variability in sensitivity over time as described for example in WO 99/21715 (McCullough et al.) and U.S. Pat. No. 6,706,466 (Lott et al.).

Problem to be Solved

The various radiation sensitive compositions of the art can readily be used to prepare negative-working imageable elements. However, there can be an alteration or variability in on-press developability and printing quality when the radiation-sensitive composition is carried on an aluminum substrate that has been anodized using sulfuric acid, and the element is subsequently exposed to a humid environment. In particular, these elements may exhibit "background staining" from undesirably retained imaging coating in non-exposed regions when high moisture is present in the environment in which they are stored or used.

There is a need to address this problem and to provide negative-working imageable elements with sulfuric acid-anodized substrates that exhibit little or no background staining under the noted conditions.

SUMMARY OF THE INVENTION

The present invention provides a method for providing a negative-working, single-layer imageable element comprising:
  A) providing a dried imageable layer formulation on a sulfuric acid-anodized aluminum substrate to form an imageable element,
  said dried imageable layer formulation comprising:
  a free radically polymerizable component,
  an initiator composition capable of generating free radicals sufficient to initiate polymerization of the free radically polymerizable component upon exposure to imaging radiation,
  a radiation absorbing compound,
  a polymeric binder comprising a polymer backbone to which is directly or indirectly linked poly(alkylene glycol) side chains, and
  B) enclosing the imageable element in a water-impermeable sheet material that substantially inhibits the transfer of moisture to and from the imageable element.
This method can further comprise:
  C) imagewise exposing (preferably on-press) the imageable element of this invention to provide exposed and non-exposed regions in the imageable layer, and
  D) developing the imagewise exposed element (preferably on-press) to remove only the non-exposed regions.
Thus, this invention also provides an enclosed imageable element according to the method of this invention, and further provides an imaged element.

This invention also provides a negative-working printing plate comprising:
  A) providing a negative-working, single-layer imageable element according to the present invention,
  B) imagewise exposing the imageable element at an imaging radiation to produce exposed and non-exposed regions in the imageable layer, and
  C) without a preheat step, developing the imagewise exposed element to remove only the non-exposed regions.

The methods of this invention provide packaged or enclosed imageable elements that can be used to provide lithographic printing plates that exhibit improved developability, especially on-press developability, even after they have been in a humid environment. The imageable elements provided by this invention have improved storage stability under these conditions and exhibit reduced background staining (that is, greater consistency in the non-exposed regions over the entire element). In addition, these elements can be used without a "preheat" step between imagewise exposure and development. Elimination of this post-exposure baking step reduces the number of pre-press variables that can affect image quality and reduces energy costs.

These advantages are achieved no matter whether the imaged elements are developed "off-press" using alkaline developers or "on-press" using fountain solutions, lithographic printing inks, or mixtures thereof. But these advantages are particularly noticeable using elements that include sulfuric acid anodized substrates.

We have found that these advantages are achieved when the imageable element is prepared and packaged or enclosed in a water-impermeable sheet material that substantially inhibits the transfer of moisture to and from the element. Further details of this inventive feature are provided below.

DETAILED DESCRIPTION OF THE INVENTION

Definitions

Unless the context indicates otherwise, the various components described herein such as "radically polymerizable component", "initiator", "co-initiator", "radiation absorbing compound", "polymeric binder", "nonionic phosphate acrylate", and similar terms also refer to mixtures of such components. Thus, the use of the articles "a", "an", and "the" is not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

By "single-layer imageable element", we mean that a single imageable layer is used for imaging chemistry, but such elements can still have various non-imaging layers under or over (such as topcoats) the single imageable layer.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers or have two or more different recurring units as part of the polymer backbone.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

The imageable elements described herein are prepared using a radiation-sensitive composition that may have any utility wherever there is a need for a coating that is polymerizable using suitable electromagnetic radiation, and particularly where it is desired to remove non-exposed regions of the coated and imaged composition. The radiation-sensitive compositions can be used to prepare imageable elements such as printed circuit boards for integrated circuits, microoptical devices, paint compositions, molding compositions, color filters, photomasks, and preferably printed forms such as lithographic printing plate precursors and packaged and imaged printing plates that are defined in more detail below.

The free radically polymerizable component present in the radiation-sensitive composition contains one or more compounds having any polymerizable group that can be polymerized using free radical initiation. For example, the free radically polymerizable component can contain one or more free radically polymerizable monomers or oligomers having one or more addition polymerizable ethylenically unsaturated groups, crosslinkable ethylenically unsaturated groups, a ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Particularly useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers, or combinations of such monomers, oligomers, and crosslinkable polymers. More particularly useful radically polymerizable components include those derived from urea urethane (meth)acrylates or urethane (meth)acrylates having multiple polymerizable groups. For example, a most preferred free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Other preferred free radically polymerizable components are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Numerous other free radically polymerizable components are known to those skilled in the art and are described in considerable literature including *Photoreactive Polymers: The Science and Technology of Resists*, A Reiser, Wiley, New York, 1989, pp. 102–177, by B. M. Monroe in *Radiation Curing: Science and Technology*, S. P. Pappas, Ed., Plenum, New York, 1992, pp. 399–440, and in "Polymer Imaging" by A. B. Cohen and P. Walker, in *Imaging Processes and Material*, J. M. Sturge et al. (Eds.), Van Nostrand Reinhold, New York, 1989, pp. 226–262. For example, useful free radically polymerizable components are also described in EP 1,182,033A1 (noted above), beginning with paragraph [0170].

In some embodiments, the free radically polymerizable component comprises carboxy groups in an amount sufficient to provide an acid number greater than 0 mg KOH per grams of polymerizable component, and generally from 0 to about 200 mg KOH per gram of the polymerizable component. Preferably, the acid number is from 0 to about 100 mg KOH/gram of polymerizable component and more preferably, it is from 0 to about 60 mg KOH/gram of polymerizable component.

Free radically polymerizable components containing carboxy groups can be prepared in a number of ways. For example, oligomers containing carboxy groups can be prepared as described in the teaching of Col. 4 (line 42) to Col. 5 (line 19) and Col. 7 (line 14) to Col. 8 (line 45) of U.S. Pat.

No. 4,228,232 (Rousseau). The carboxy groups can be added to the oligomers preferably after addition of the free radically polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)acrylate can be prepared from the reaction of a diisocyanate with a diol having free carboxy groups similarly to the preparation of allyl functional polyurethanes described in U.S. Pat. No. 5,919,600 (Huang et al.).

The free radically polymerizable component is present in the radiation-sensitive composition in an amount sufficient to render the composition insoluble after exposure to imaging radiation. For example, the weight ratio of free radically polymerizable component to the polymeric binder (described below) is generally from about 5:95 to about 95:5, preferably from about 10:90 to about 90:10, and more preferably from about 30:70 to about 70:30. The free radically polymerizable component can be present in an amount of from about 10 to about 70%, preferably from about 20 to about 50%, based on the total solids in the radiation sensitive composition, or the total dry weight of the imageable layer.

The radiation-sensitive composition also includes an initiator composition that is capable of generating free radicals sufficient to initiate polymerization of the free radically polymerizable component upon exposure of the composition to imaging radiation. The initiator composition may be responsive, for example, to electromagnetic imaging radiation in the ultraviolet, visible and/or infrared spectral regions, corresponding to the spectral range of from about 150 nm to about 1500 nm. UV and visible light sensitivity is generally from about 150 nm to about 700 nm and in some embodiments, the radiation-sensitive composition is sensitive to imaging radiation of from about 250 nm to about 450 nm (and preferably from about 375 nm to about 450 nm) and includes an appropriate initiator composition for that imaging region. In preferred embodiments, the initiator composition is responsive to imaging infrared or near infrared radiation range of from about 600 nm to about 1500 nm, and more preferably to imaging infrared radiation in the range of from about 700 nm to about 1200 mm and initiator compositions are used that are appropriate to that imaging range.

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with from about 2 carboxy groups of which from about one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogeno-methylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbisimidazoles, or "HABI's") as described for example in U.S. Pat. No. 4,565,769 (Dueber et al.), 3-ketocoumarins for UV and visible light activation, borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (noted above).

Particularly useful initiator composition components for UV and visible light sensitive radiation-sensitive compositions include hexaarylbisimidazoles such as, for example, 2,2'-bis(2-chlorophenyl)-4,4',5,5'-tetraphenyl-biimidazole. The triazines noted below can be used with exposure to imaging radiation at about any wavelength including UV and visible radiation exposure.

Typical UV radiation-sensitive free-radical generating compounds include but are not limited to, ketocoumarins (particularly in combination with a polycarboxylic acid free radical generating compound, such as anilino-N,N-diacetic acid as a secondary co-initiator), trichloromethyl triazines as described, for example, in U.S. Pat. No. 4,997,745 (Kawamura et al.), 2,4,5-triaryloxazoles, and diaryliodonium salts. Secondary co-initiators can also be used, such as metallocenes (such as titanocenes and ferrocenes), polycarboxylic acids, haloalkyl triazines, triarylimidazolyl dimers, thiols or mercaptans (such as mercaptotriazoles), hexaaryl bisimidizoles, borate salts, and photooxidants containing a heterocyclic nitrogen that is substituted by an alkoxy or acyloxy group, as described in U.S. Pat. No. 5,942,372 (West et al.).

For the preferred IR-sensitive radiation-sensitive compositions, the more preferred initiator compositions comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents.

The onium salts generally include a suitable number of negatively-charged counterions such as halides, hexafluorophosphate, thiosulfate, hexafluoroantimonate, tetrafluoroborate, sulfonates, diazonium, hydroxide, perchlorate, borates (including tetraaryl-, tetralkyl-, monoalkyltriaryl-, and dialkyldiarylborates), and others readily apparent to one skilled in the art. The preferred counterions are the tetraarylborates including tetraphenylborate.

The halonium salts are the more preferred onium salts, and the iodonium salts such as the diaryliodonium salts, are most preferred, particularly with the tetraarylborate counterions. In one preferred embodiment, the onium salt has a positively-charged iodonium, (4-methylphenyl)[4-(2-methylpropyl)phenyl]-moiety and a suitable negatively charged counterion, such as tetraphenylborate. A representative example of such an iodonium salt is available as Irgacure®

250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution. Another particularly useful iodonium salt is bis(4-t-butylphenyl)iodonium tetraphenylborate.

Particularly useful boron components include organic boron salts that include an organic boron anion such as those described in U.S. Pat. No. 6,569,603 (noted above) that is paired with a suitable cation such as an alkali metal ion, an onium, or a cationic sensitizing dye. Iodonium salts and particularly diaryliodonium tetraarylborates are particularly useful as initiator compounds in radiation-sensitive compounds that are designed for "on-press" development (described in more detail below). They may be used alone or in combination with various co-initiators such as heterocyclic mercapto compounds including mercaptotriazoles, mercapto-benzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of from about 0.5 to about 10 weight % based on the total solids of the radiation-sensitive composition. The mercaptotriazoles are preferred in these combinations of compounds.

Some initiator compositions particularly useful in imageable elements that are designed for "off-press" development using a negative-working developer, include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Especially useful azine compounds are triazine compounds that include a 6-membered ring containing 3 carbon atoms and 3 nitrogen atoms such as those described in U.S. Pat. No. 6,309,792 (Hauck et al.), U.S. Pat. No. 6,010,824 (Komano et al.), U.S. Pat. No. 5,885,746 (Iwai et al), U.S. Pat. No. 5,496,903 (Watanabe et al.), and U.S. Pat. No. 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are useful in the initiator composition. Representative compounds of this type include but are not limited to, 1,3,5-triazine derivatives such as those having 1 to 3 —$CX_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis (trichloromethyl)-s-triazine, 2-(p-methoxystyryl)-4,6-bis (trichloromethyl)-s-triazine, 2-(4-methoxy-naphtho-1-yl)-4, 6-bis(trichloromethyl)-s-triazine, 2-(4-ethoxynaphtho-1-yl)-4,6-bis(trichloromethyl)-s-triazine, and 2-(4-(2-ethoxyethyl)-naphtho-1-yl)-4,6-bis(trichloromethyl)-s-triazine], 2-(4-methylthiophenyl)-4,6-bis(trichloromethyl)-2-triazine, 2-(4-chlorophenyl-4,6-bis(trichloromethyl)-2-triazine, 2,4,6-tri(trichloromethyl)-2-triazine, and 2,4,6-tri (tribromomethyl)-2-triazine.

The azine compounds and particularly the triazine compounds may be used alone or in combination with one or more co-initiators such as titanocenes, mono- and polycarboxylic acids, hexaarylbisimidazoles, as described for example in U.S. Pat. No. 4,997,745 (Kawamura et al.).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1, 5-diphenyl-1,2,4-triazole, and 5-(p-aminophenyl)-3-mercapto-1,2,4-triazole. Various mercaptobenzimidazoles, mercaptobenzothiazoles, and mercaptobenzoxazoles may also be present.

Thus, several initiator/co-initiator combinations can be used in various embodiments of imageable elements, namely:

a) a triazine as described above in combination with a co-initiator that is an N-aryl, S-aryl, or O-aryl polycarboxylic acids with from about 2 carboxy groups of which from about one is bonded to the nitrogen, oxygen, or sulfur atom of the aryl moiety (such as aniline diacetic acid and derivatives thereof) as described above, b) a triazine as described above in combination with a co-initiator that is a mercaptan derivative as described above, c) an iodonium salt (such as an iodonium borate) as described above in combination with a co-initiator that is a metallocene (for example a titanocene or ferrocene) as described for example in U.S. Pat. No. 6,936,384 (noted above), and d) an iodonium salt (such as a diaryliodonium tetraarylborate) as described above in combination with a co-initiator that is a mercaptotriazole as described above.

The free radical generating compounds in the initiator composition are generally present in the radiation-sensitive composition in an amount of from about 0.5% to about 30%, and preferably from about 1 to about 15%, based on composition total solids or total dry weight of the imageable layer. The optimum amount of the various sensitizers may differ for various compounds and the sensitivity of the radiation-sensitive composition that is desired and would be readily apparent to one skilled in the art.

Any of a variety of polymeric binders can be used in the radiation-sensitive composition, including those known in the art for use in negative-working radiation-sensitive compositions. The polymeric binders generally have a molecular weight of from about 2,000 to about 1,000,000, preferably from about 10,000 to about 200,000, and most preferably from about 10,000 to about 100,000. The acid value (mg KOH/g) of the polymeric binder is generally from about 0 to about 400, preferably from about 10 to about 200, and most preferably from about 10 to about 130, as determined using known methods. However, the predominant polymeric binders (from about 60 weight % of total dry polymeric binders) in the radiation-sensitive composition (and imageable elements described below) are those having poly(alkylene glycol) side chains directly or indirectly linked to the polymeric backbone. Preferably, from about 5 weight % to about 100 weight % of the total polymeric binders are composed of one or more of such polymeric binders.

Many of such polymeric binders are dispersible, developable, or soluble in water or water/solvent mixtures such as fountain solutions, in lithographic printing inks, or in mixtures of fountain solutions and lithographic printing inks. Such polymeric binders include polymeric emulsions, dispersions, or polymers having the pendant poly(alkylene glycol) side chains that can render the imageable elements as "on-press" developable. Such polymeric binders are described for example in U.S. Pat. Nos. 6,582,882 and 6,899,994 (both noted above). In some instances, these polymeric binders are present in the imageable layer from about partially, but preferably entirely, as discrete particles.

Other useful polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene glycol) side chains.

These polymeric binders comprise poly(alkylene glycol) side chains. These polymers can be graft copolymers having a main chain polymer and poly(alkylene glycol) pendant side chains. Other polymers are block copolymers having blocks or segments of (alkylene glycol)-containing recurring units and non(alkylene glycol)-containing recurring units. Both graft and block copolymers can additionally have pendant cyano groups attached directly to the hydrophobic backbone. The alkylene glycol side chains generally comprise from about 10 constitutional alkylene glycol units and up to 150 of such units, preferably from about 10 to about 100 of such units, more preferably from about 10 to about 50 of such alkylene glycol units, and most preferably from about 15 to about 50 of such alkylene glycol units. The constitutional alkylene glycol units can be the same or different in an individual side chain and are generally $C_1$ to $C_6$ alkylene glycol groups, and more typically $C_1$ to $C_3$ alkylene glycol groups. The alkylene portions can be linear or branched or substituted versions thereof. Poly(ethylene glycol) and poly(propylene glycol) side chains are preferred and poly(ethylene glycol) side chains are most preferred.

As noted above, in some embodiments, the polymeric binders comprise recurring units comprising the poly(alkylene glycol) side chains as well as recurring units having pendant cyano groups attached directly to the hydrophobic backbone. By way of example only, such recurring units can comprise pendant groups comprising —CN, cyano-substituted or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

By way of example, polymeric binders that are particularly useful in the IR-sensitive compositions and imageable elements can be formed by polymerization of a combination or mixture of suitable ethylenically unsaturated polymerizable monomers or macromers, such as:

A) acrylonitrile, methacrylonitrile, or a combination thereof,

B) poly(alkylene glycol) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, vinyl carbazole, methacrylate esters, acrylamide, N-phenyl maleimide, carboxyphenyl methacrylamide, allyl methacrylate, carboxyphenyl maleimide, 2-acrylamido-2-methyl-1-propane sulfonic acid, methacrylamide, or a combination of such monomers.

In other embodiments of the invention that are sensitized to be imaged with imaging radiation at a wavelength of from about 250 to about 450 nm, the polymeric binders further comprise pendant carboxy groups attached directly or indirectly to the polymer backbone. Such pendant carboxy groups are generally provided by incorporating carboxy-containing recurring units into the polymeric binder chain.

The amount of the poly(alkylene glycol) side chains in such polymeric binders is from about 0.5 to about 60 weight %, preferably from about 2 to about 50 weight %, more preferably from about 5 to about 40 weight %, and most preferably from about 5 to about 20 weight %, based on the total polymeric binder weight. The amount of poly(alkylene glycol) segments in block copolymers is generally from about 5 to about 60 weight %, preferably from about 10 to about 50 weight %, and more preferably from about 10 to about 30 weight %. It is also preferred for some embodiments that the polymeric binders having poly(alkylene glycol) side chains are present from about partially in the form of discrete particles.

Where the polymeric binders comprise pendant cyano groups, the amount of such cyano groups is from about 5 to about 99.5 weight %, preferably from about 10 to about 80 weight %, and most preferably from about 25 to about 60 weight %, based on the total polymeric binder weight.

The polymeric binders comprising (alkylene glycol) side chains are generally present in an amount of from about 10 to about 90%, and preferably from about 20 to about 80%, based on the total solids content of the radiation-sensitive composition or the dry weight of the imageable layer prepared therefrom.

In some embodiments, it may be useful to include "secondary" polymeric binder in combination with the polymeric binders described above. Such secondary polymeric binders include acrylic-urethane hybrid polymers that are commercially available in dispersions from Air Products and Chemicals, Inc. (Allentown, Pa.) under the tradename Hybridur, for example, the Hybridur 540, 560, 570, 580, 870, and 878 acrylic-urethane hybrid dispersions. Other secondary polymeric binders are water-insoluble but soluble in conventional alkaline developers. Examples of such polymeric binders include but are not limited to, (meth)acrylic acid and acid ester resins [such as (meth)acrylates], polyvinyl acetals, phenolic resin, polymers derived from styrene, N-substituted cyclic imides or maleic anhydrides, such as those described in EP 1,182,033 (noted above) and U.S. Pat. No. 6,309,792 (noted above), U.S. Pat. No. 6,352,812 (Shimazu et al.), U.S. Pat. No. 6,569,603 (noted above), and U.S. Pat. No. 6,893,797 (noted above). Also useful are the polymers having pendant carbazole groups described in copending and commonly assigned U.S. Ser. No. 11/356,518 (filed Feb. 17, 2006 by Tao et al.) and the polymers having pendant reactive vinyl groups as described in copending and commonly assigned Ser. No. 11/349,376 (filed Feb. 7, 2006 by Tao et al.). The secondary polymeric binder may be present in the radiation-sensitive composition in an amount of from about 5 to about 40 weight % based on the total solids content of the composition, or the dry coated weight of the imageable layer.

The radiation-sensitive composition generally includes one or more radiation absorbing compounds, or sensitizers, that absorb imaging radiation, or sensitize the composition to imaging radiation having a $\lambda_{max}$ of from the UV to the IR region of the electromagnetic spectrum, that is, from about 150 nm to about 1500 nm. Some sensitizers can be used at any wavelength, but most sensitizers are optimally useful within certain wavelength ranges. For example, some sensitizers are optimal for use at an exposure wavelength of from about 250 nm to about 650 nm (UV to visible) and particular UV at from about 250 to about 450 nm, while others are optimal for use at an exposure wavelength of from about 650 nm to about 1500 nm (near IR and IR).

In some embodiments, the radiation-sensitive composition contains a UV sensitizer where the free-radical generating compound is UV radiation sensitive (that is from about 250 nm to about 450 nm), thereby facilitating photopolymerization. Typical UV radiation-sensitive free-radical generating compounds are described above. In some of these embodiments, the radiation sensitive compositions are sensitized to "violet" radiation in the range of from about 375 nm to about 450 nm. Useful sensitizers for such compositions include certain pyrilium and thiopyrilium dyes.

Sensitizers that absorb in the visible region of the electromagnetic spectrum (that is from about 400 nm to about 650 nm) can also be used. Examples of such sensitizers are well known in the art and include the compounds described in Cols. 17–22 of U.S. Pat. No. 6,569,603 (noted above). Other useful visible and UV-sensitive sensitizing compositions include a cyanine dye, diaryliodonium salt, and a co-initiator (as described above) as described in U.S. Pat. No. 5,368,990 (Kawabata et al.).

Other useful sensitizers for the violet/visible region of sensitization are the 2,4,5-triaryloxazole derivatives as described in WO 2004/074930 (Baumann et al.). These compounds can be used alone or with a co-initiator as described above, and especially with the 1,3,5-triazines described above or with thiol compounds. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan, oxazole, or oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —N($R'_4$)($R'_5$) group, or a —O$R'_6$ group wherein $R'_4$ through $R'_6$ independently represent substituted or unsubstituted alkyl or aryl groups as defined above. Preferably, from about one of $R'_1$ through $R'_3$ is an —N($R'_4$)($R'_5$) group wherein $R'_4$ and $R'_5$ are the same or different alkyl groups. Preferred substituents for each $Ar_1$ group include the same or different primary, secondary, and tertiary amines and more preferably they are the same dialkylamines.

Still another class of useful violet/visible radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, ozazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Particularly useful combinations of 2,4,5-triaryloxazole derivatives (such as 2,4,5-triaryloxazolyl dimers) and thiol compounds include either or both of 2,2'-bis(o-chlorophenyl-4,4',5,5'-tetraphenylbiimidazole) or 2,2'-bis(o-chlorophenyl-4,4',5,5'-tetra(m-methoxyphenyl)biimidazole) with any of mercaptobenzthiazole, mercaptobenzimidazole, and mercaptotriazole.

Additional useful "violet"-visible radiation sensitizers are the compounds described in WO 2004/074929 (Baumann et al.). These compounds comprise the same or different aromatic heterocyclic groups connected with a spacer moiety that comprises from about one carbon—carbon double bond that is conjugated to the aromatic heterocyclic groups, and are represented in more detail by Formula (I) of the noted publication.

In embodiments of this invention that are sensitive to infrared radiation, the radiation-sensitive compositions can further comprise an infrared radiation absorbing compound ("IR absorbing compounds") that absorbs radiation of from about 700 nm to about 1500 nm and preferably of from about 750 nm to about 1200 nm. For imageable elements designed for on-press development, it is particularly useful for such IR absorbing compounds to be used in combination with onium salts to enhance polymerization of the polymerizable component and to produce a more durable printing plate.

Useful IR-sensitive radiation absorbing compounds include carbon blacks and other IR-absorbing pigments and various IR-sensitive dyes ("IR dyes"). Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.) that is incorporated herein by reference. Cyanine dyes may also be useful in combination with a trihalomethyl triazine and an organoboron salt as described for example in U.S. Pat. No. 5,496,903 (Watanabe et al.).

A general description of one class of suitable cyanine dyes is shown by the formula in paragraph [0026] of WO 2004/101280, incorporated herein by reference, and two specific examples of useful IR absorbing compounds are identified below with the Examples as IR Dyes 1 and 2.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example, in U.S. Pat. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound (or sensitizer) can be present in the radiation-sensitive composition in an amount generally of from about 0.1% to about 30% and preferably from about 2 to about 15%, based on total solids in the composition, which also corresponds to the total dry weight of the imageable layer. Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used.

The radiation-sensitive composition can further comprise one or more nonionic phosphate acrylates, each of which has a molecular weight generally of from about 250 and preferably from about 300 to about 1000. By "nonionic" we mean that the phosphate acrylates not only are neutral in charge but they have no internal positive or negative charges. Thus, they are not internal salts or salts formed with an external cation or anion. Moreover, by "phosphate acrylate" we also meant to include "phosphate methacrylates" and other derivatives having substituents on the vinyl group in the acrylate moiety.

Each phosphate moiety is connected to an acrylate moiety by an alkyleneoxy chain, that is a -(alkylene-O)$_m$— chain composed of from about one alkyleneoxy unit, in which the alkylene moiety has 2 to 6 carbon atoms and can be either linear or branched and m is 1 to 10. Preferably, the alkyleneoxy chain comprises ethyleneoxy units, and m is from 2 to 8 and more preferably, m is from 3 to 6. The alkyleneoxy chains in a specific compound can be the same or different in length and have the same or different alkylene group.

More particularly, the nonionic phosphate acrylates useful in this invention can be represented by the following Structure (I):

$$P(=O)(OH)_n(R)_{3-n} \quad (I)$$

wherein the R groups are independently the same or different groups represented by the following Structure (II):

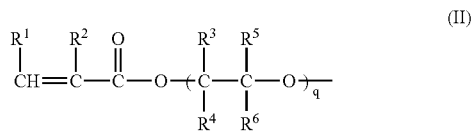

(II)

wherein $R^1$ and $R^2$ are independently hydrogen, or a halo group (such as fluoro, chloro, bromo, or iodo) or a substituted or unsubstituted alkyl group having 1 to 4 carbon atoms (such as methyl, chloromethyl, ethyl, isopropyl, n-butyl, and t-butyl). Preferably, $R^1$ and $R^2$ are independently hydrogen, methyl, or chloro, and more preferably, they are independently hydrogen or methyl.

$R^3$ through $R^6$ are independently hydrogen or a substituted or unsubstituted alkyl group having 1 to 5 carbon atoms (such as methyl, chloromethyl, hydroxymethyl, ethyl, iso-propyl, n-butyl, t-butyl, and n-pentyl). Preferably, $R^3$ through $R^6$ are independently hydrogen or substituted or unsubstituted methyl or ethyl groups, and more preferably, they are independently hydrogen or unsubstituted methyl groups.

Also, in Structure I, n is 1 or 2 and is preferably 2.

In Structure II, q is 1 to 10, preferably, 2 to 8, and more preferably 3 to 6.

Representative nonionic phosphate acrylates useful in this invention include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan) that is shown below, a phosphate of caprolactone modified 2-hydroxyethyl methacrylate that is available as Kayamer PM-21 (Nippon Kayaku, Japan) that is also shown below, and an ethylene glycol methacrylate phosphate with 4–5 ethoxy groups that is available as Phosmer PE from Uni-Chemical Co., Ltd. (Japan) that is also shown below. Other useful nonionic phosphate acrylates are also shown below.

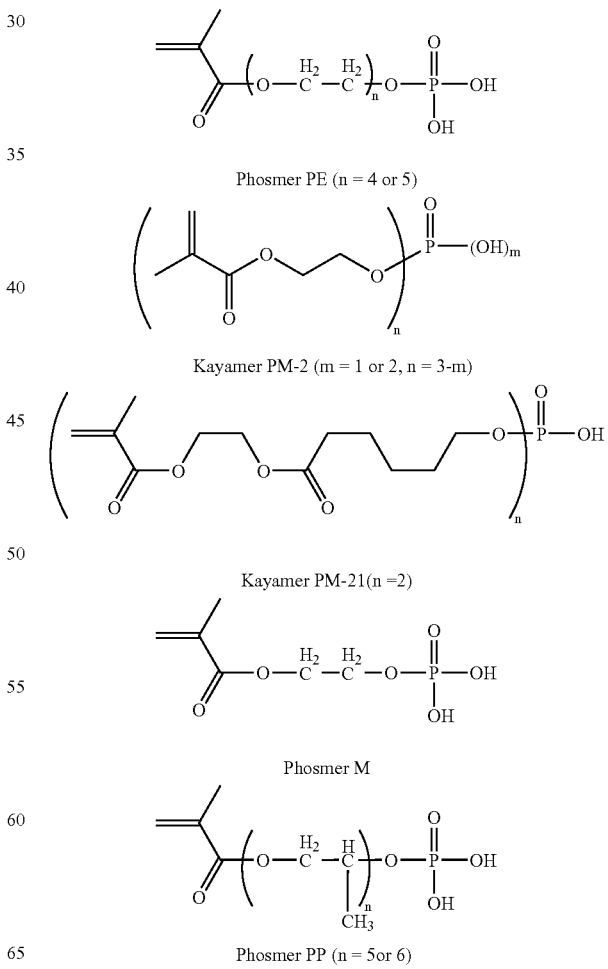

Phosmer PE (n = 4 or 5)

Kayamer PM-2 (m = 1 or 2, n = 3-m)

Kayamer PM-21(n =2)

Phosmer M

Phosmer PP (n = 5 or 6)

The nonionic phosphate acrylate can be present in the radiation-sensitive composition in an amount of from about 0.6 to about 20% and preferably from about 0.9 to about 10%, by weight of the total solids. In the dry imageable layers of the imageable elements, the amount of nonionic phosphate acrylate is present in an amount of from about 8 mg/m$^2$ to about 300 mg/m$^2$ and preferably from about 10 to about 150 mg/m$^2$.

The radiation-sensitive composition can also include a "primary additive" that is a poly(alkylene glycol) or an ether or ester thereof that has a molecular weight of from about 200 to about 4000 (preferably from about 500 to about 2000). This primary additive is present in an amount of from about 2 to about 50 weight % (preferably from about 5 to about 30%) based on the total solids content of the composition, or the total dry weight of the imageable layer.

Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The radiation-sensitive composition can also include a "secondary additive" that is a poly(vinyl alcohol), a poly(vinyl pyrrolidone), poly(vinyl imidazole), or polyester in an amount of up to and including 20 weight % based on the total solids content of the composition, or the total dry weight of the imageable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The imageable elements are formed by suitable application of a radiation-sensitive composition as described above to a suitable substrate to form an imageable layer. This substrate can be treated or coated in various ways as described below prior to application of the radiation-sensitive composition. Preferably, there is only a single imageable layer comprising a radiation-sensitive composition described herein. If the substrate has been treated to provide an "interlayer" for improved adhesion or hydrophilicity, the applied radiation-sensitive composition is generally considered the "top" or outermost layer. These interlayers, however, are not considered "imageable layers". While there is usually no need to apply what is conventionally known as an overcoat (such as an oxygen impermeable topcoat) to the imageable layer(s) as described in WO 99/06890 (Pappas et al.), it can be disposed thereon if desired. Such overcoat layers can comprise one or more water-soluble polymers such as poly(vinyl alcohol), poly(vinyl pyrrolidone), poly (ethyleneimine), and poly(vinyl imidazole) and generally have a dry coating weight of from about 0.1 to about 4 g/m$^2$.

The substrate generally has a hydrophilic surface, or from about a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof, and aluminum supports are most preferred.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including roughening of some type by physical (mechanical) graining, electrochemical graining, or chemical graining, then usually followed by acid anodizing. More preferably, the aluminum support is roughened by physical or electrochemical graining and then anodized using phosphoric or sulfuric acid and conventional procedures. A most preferred substrate is an electrochemically grained and sulfuric acid anodized aluminum support.

An interlayer may be formed by treatment of the aluminum support with, for example, a silicate, dextrine, calcium zirconium fluoride, hexafluorosilicic acid, poly(vinyl phosphonic acid) (PVPA), vinyl phosphonic acid copolymer, poly(acrylic acid), or acrylic acid copolymer. Still further, the aluminum support may be treated with a phosphate solution that may further contain an inorganic fluoride (PF) such as sodium fluoride. Preferably, the aluminum support is electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Preferably, the radiation-sensitive composition is applied as the outermost layer.

Illustrative of such manufacturing methods is mixing the radically polymerizable component, initiator composition, radiation absorbing compound, polymeric binder, primary additive, and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Preferred coating solvents and representative imageable layer formulations are described in the Examples below. After proper drying, the coating weight of the imageable layer is generally from about 0.1 to about 5 $g/m^2$, preferably from about 0.5 to about 3.5 $g/m^2$, and more preferably from about 0.5 to about 2 $g/m^2$.

Layers can also be present under the imageable layer to enhance developability or to act as a thermal insulating layer. The underlying layer should be soluble or from dispersible in the developer and preferably have a relatively low thermal conductivity coefficient.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element is enclosed in water-impermeable material that substantially inhibits the transfer of moisture to and from the imageable element.

By "enclosed", we mean that the imageable element is wrapped, encased, enveloped, or contained in a manner such that both upper and lower surfaces and all edges are within the water-impermeable sheet material. Thus, none of the imageable element is exposed to the environment once it is enclosed.

Useful water-impermeable sheet materials include but are not limited to, plastic films, metal foils, and waterproof papers that are usually in sheet-form and sufficiently flexible to conform closely to the shape of the imageable element (or stack thereof as noted below) including an irregularities in the surfaces. Preferably, the water-impermeable sheet material is in close contact with the imageable element (or stack thereof). In addition, it is preferred that this material is sufficiently tight or is sealed, or both, so as to provide a sufficient barrier to the movement or transfer of moisture to or from the imageable element. Preferred water-impermeable materials include plastic films such as films composed of low density polyethylene, polypropylene, and poly(ethylene terephthalate), metallic foils such as foils of aluminum, and waterproof papers such as papers coated with polymeric resins or laminated with metal foils (such as paper backed aluminum foil). The plastic films and metallic foils are most preferred. In addition, the edges of the water-impermeable sheet materials can be folded over the edges of the imageable elements and sealed with suitable sealing means such as sealing tape and adhesives.

The transfer of moisture from and to the imageable element is "substantially inhibited", meaning that over a 24-hour period, the imageable element neither loses nor gains no more than 0.01 g of water per $m^2$. The imageable element (or stack) can be enclosed or wrapped while under vacuum to remove most of the air and moisture. In addition to or instead of vacuum, the environment (for example, humidity) of the imageable element can be controlled (for example to a relative humidity of less than 20%), and a desiccant can be associated with the imageable element (or stack).

Preferably, the imageable element is enclosed with the water-impermeable sheet material as part of a stack of imageable elements, which stack contains at least 5 imageable elements and more generally at least 100 and preferably at least 500 imageable elements that are enclosed together. It may be desirable to use "dummy", "reject", or non-photosensitive elements at the top and bottom of the stack improve the wrapping. Alternatively, the imageable element can be enclosed in the form of a coil that can be cut into individual elements at a later time. Generally, such a coil has at least 1000 $m^2$ of imageable surface, and commonly at least 3000 $m^2$ of imageable surface.

Adjacent imageable elements in the stacks or adjacent spirals of the coil may be separated by interleaving material, for example interleaving paper or tissue ("interleaf paper") that may be sized or coated with waxes or resin (such as polyethylene) or inorganic particles. Many useful interleaving materials are commercially available. They generally have a moisture content of less than 8%, preferably less than 6%, and more preferably less than 5%.

Imaging Conditions

During use, the imageable element is exposed to a suitable source of imaging radiation such as UV, visible light, near-infrared, or infrared radiation, depending upon the radiation absorbing compound present in the radiation-sensitive composition, at a wavelength of from about 150 to about 1500 nm. In some embodiments, imaging is carried out using a source of UV or "violet" imaging radiation of from about 250 to about 450 nm and preferably of from about 375 to about 450 nm. Preferably, imaging is carried out using imaging radiation, such as from an infrared laser at a wavelength of from about 700 to about 1400 nm and preferably of from about 700 to about 1200 nm. Imaging can be carried out using imaging radiation at multiple wavelengths at the same time if desired.

The laser used to expose the imageable element is preferably a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging infrared radiation imaging can be carried out generally at imaging energies of from about 30 $mJ/cm^2$ to about 500 $mJ/cm^2$, preferably from about 50 to about 300 $mJ/cm^2$ depending upon the sensitivity of the imageable layer. Imaging radiation in the UV to visible region of the spectrum can be carried out generally using an energy of from about 0.01 $mJ/cm^2$ to about 0.5 $mJ/cm^2$, and preferably from about 0.02 to about 0.1 $mJ/cm^2$.

While laser imaging is preferred, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Without the need for a pre-heat step after imaging, the imaged elements can be developed "off-press" using conventional processing and a conventional aqueous alkaline or organic solvent-based alkaline developer. Alternatively and preferably, the imaged elements can be developed, or imaged and developed, "on-press" as described in more detail below.

For off-press development, the developer composition commonly includes surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the alkaline developer is preferably of from about 8 to about 14. The imaged elements are generally developed using conventional processing conditions. Both aqueous alkaline developers and solvent-based developers can be used.

Aqueous alkaline developers generally have a pH of at least 7 and preferably of at least 11. Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-based developers are generally single-phase solutions of one or more organic solvents that are miscible with or dispersible in water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. Such developers can be alkaline, neutral, or slightly acidic in pH.

Representative solvent-based developers include ND-1 Developer, Developer 980, 2 in 1 Developer, Violet 500 Developer, and 956 Developer (available from Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following off-press development, the imaged element can be rinsed with water and dried in a suitable fashion. The dried element can also be treated with a conventional gumming solution (preferably gum arabic). In addition, a postbake operation can be carried out, with or without a blanket exposure to UV or visible radiation.

Printing can be carried out by applying a lithographic printing ink and fountain solution to the printing surface of the imaged and developed element. The fountain solution is taken up by the non-imaged regions, that is, the surface of the hydrophilic substrate revealed by the imaging and development steps, and the ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Preferred imageable elements described herein are designed for imaging, development, or imaging and development while "on-press". This type of development avoids the use of the developing solutions described above. The element is directed mounted on press wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The following examples are provided to illustrate the practice of the invention but are by no means intended to limit the invention in any manner.

EXAMPLES

The components and materials used in the examples and analytical methods used in evaluation were as follows. Unless otherwise indicated, the chemical components are available from Aldrich Chemical Company (Milwaukee, Wis.).

Black wrapping used comprised 2.5–6 mil (0.0063–0.015 cm) low-density polyethylene.

BLO represents γ-butyrolactone.

Blue 63 is 3-(4-diethylamino-2-ethoxyphenyl)-3-(1-ethyl-2-methylindol-3-yl)-4-azaphthalide that was obtained from Yamamoto Chemicals, Inc. (Japan).

Byk® 336 surfactant was obtained from Byk Chemie (Wallingford, Conn.).

DHBP represents dihydroxybenzophenone.

Elvacite® 4026 is a 10% (wt.) solution of a highly-branched poly(methyl methacrylate) in methyl ethyl ketone that was obtained from Ineos Acrylica, Inc. (Cordova, Tenn.).

Graft Copolymer 1 is a 24 weight % dispersion in a 76:24 mixture of n-propanol and water and is a copolymer with the composition of PEGMA/acrylonitrile/styrene with a weight ratio of 10/70/20.

IB-05 represents bis(4-t-butylphenyl)iodonium tetraphenylborate.

The interleaving paper used was Thilmany Kraft, 30-pound (13.6 kg) XKL interleaving with a moisture content of 4% (range of 3–5.5%).

Irgacure® 250 contains iodonium, (4'-methylphenyl)[4-(2-methylpropyl)phenyl]-iodonium hexafluorophosphate that was obtained from Ciba Specialty Chemicals (Tarrytown, N.Y.) as a 75% (weight) solution in propylene carbonate.

IR Dye 1 represents a cyanine dye that has the following structure:

IR Dye 2 is a cyanine dye that was obtained from Showa Denko (Japan) that has the following structure:

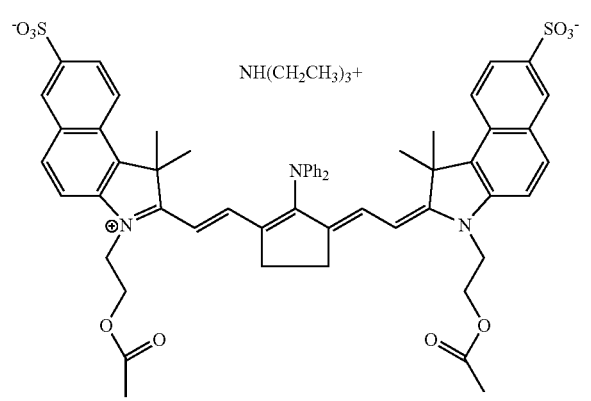

Klucel® E and Klucel® M are hydroxypropyl celluloses that were obtained from Hercules Inc. (Wilmington, Del.).

MEK represents methyl ethyl ketone (or 2-butanone).

Mercapto-3-triazole represents 3-mercapto-1,2,4-triazole that was obtained from PCAS (Paris, France).

Moisture-proof packing tape used was Scotch® Superior Performance Box Sealing Tape 375 that is available from 3M Corp. (St. Paul, Minn.).

Oligomer 1 represents a urethane acrylate that was prepared by reacting 2 parts of hexamethylene diisocyanate with 2 parts of hydroxyethyl methacrylate and 1 part of 2-(2-hydroxyethyl)piperidine (30% (weight) solution in ethyl acetate).

PEGDA represents a poly(ethylene glycol) diacrylate ($M_w$=700).

PF#1 represents a post-treatment with an inorganic monosodium phosphate solution activated by sodium fluoride to provide an oxide film of 2.5 g/m².

PF#2 represents a post-treatment with an inorganic monosodium phosphate solution activated by sodium fluoride to provide an oxide film of 3.8 g/m².

Phosmer PE is an ethylene glycol methacrylate phosphate with 4–5 ethoxy groups and Phosmer MH is methacryloyl oxyethyl acid phosphate monoethanol amine half salt, both of which were obtained from Uni-Chemical Co. Ltd. (Japan).

PVPA represents treatment of the substrate with poly (vinyl phosphonic acid).

SR 355 is a ditrimethylolpropane tetraacrylate that is available from Sartomer Company (Exton, Pa.).

SR 399 is a dipentaerythritol pentaacrylate that is available from Sartomer Company (Exton, Pa.).

Examples 1 and 2

On an electrochemically-grained and sulfuric acid-anodized aluminum substrates, that had been post-treated with either PVPA, PF #1 or PF #2, each of the imageable layer formulations described in TABLE I below were applied to provide imageable layers having a dry coating weight of 1.5 g/m². The formulations were applied using a slotted-hopper and then dried for approximately 60 seconds at 180° F. (about 82.2° C.).

TABLE I

| Component | Example 1 (parts by weight) | Example 2 (parts by weight) |
|---|---|---|
| Oligomer 1 | 1.24 | 2.25 |
| SR 399 | 0.83 | 0 |
| SR 355 | 0 | 0.23 |
| Graft Copolymer 1 | 4.99 | 7.08 |
| Klucel ® E | 0.20 | 0.23 |
| Irganox ® 1035 | 0 | 0.02 |
| Irgacure ® 250 | 0.25 | 0.29 |
| Mercapto-3-triazole | 0.11 | 0.13 |
| IR Dye #1 | 0.16 | 0 |
| IR Dye #2 | 0 | 0.09 |
| Byk ® 336 | 0.36 | 0.41 |
| Phosmer PE | 0.20 | 0 |
| 1-Propanol | 64.01 | 62.38 |
| Water | 8.69 | 8.26 |
| 2-Butanone | 18.96 | 18.65 |

Samples of each resulting imageable element were treated under various conditions in order to accelerate the effects of ageing. In one test, the elements were wrapped in interleaving paper and paper-backed aluminum foil and then heat-treated for 5 days at 48° C. (dry test). Other elements were hung in a humidity chamber for 5 days at 38° C. and 80% relative humidity (humidity test). Still other elements were interleaved and wrapped in a black polyethylene sheet that was sealed with moisture proof packing tape. The sealed package was then placed in the humidity chamber for 5 days at 38° C., 80% relative humidity.

Imageable elements from each aging test were exposed from 50 to 300 mJ/cm$^2$ using a Creo® Trendsetter 3244x platesetter. The resulting imaged elements were then directly mounted onto an ABDick duplicator press charged with Van Son rubber-based black ink. The fountain solution was Varn 142W etch at 3 ounces per gallon (22.5 g/liter) and PAR alcohol replacement at 3 ounces per gallon (22.5 g/liter). The press was run for 200 impressions with each element.

Development of the imaged elements on-press was assessed from the press sheets by evaluating the number of sheets necessary to achieve a clean printing background. Typically, less than 100 sheets (for a clean printing background) are considered acceptable development for plates mounted on an ABDick duplicator press. TABLE II below provides the development results for Examples 1 and 2.

TABLE II

| Example | Substrate | No Treatment (fresh) | 5 days 48° C. | 5 days, 38° C. 80% RH | 5 days, 38° C., 80% RH (sealed bag) |
|---|---|---|---|---|---|
| 1 | PF #1 | 1 | 5 | >200 | 1 |
| 1 | PF #2 | 1 | 50 | >200 | 1 |
| 2 | PVPA | 1 | 50 | >200 | 75 |

As can be seen from these results, all "fresh" imaged elements were fully developed at the first impression (sheet 1). None of the imaged elements passed the 5-day humidity test, with each element showing no significant development by 200 sheets. However, when the imaged elements were sealed in a moisture proof wrapping and then heat-treated according to this invention for 5 days at 38° C., 80% relative humidity, the development rate was increased to an acceptable rate.

Examples 3 and 4

On electrochemically-grained and sulfuric acid anodized aluminum substrates that had been post-treated with PVPA, the imaging layer formulations described in TABLE III below were applied to provide imageable layers having a dry coating weight of 1.0 g/m$^2$ by using a wire-wound rod and then dried for approximately 90 seconds residence time in a Ranar conveyor oven set at about 100° C.

TABLE III

| Component | Example 3 (parts by weight) | Example 4 (parts by weight) |
|---|---|---|
| Oligomer 1 | 1.38 | 1.30 |
| SR 399 | 0.87 | 0.57 |
| PEGDA | 0.35 | 0.27 |
| Graft Copolymer 1 | 5.70 | 5.51 |
| Klucel ® E | 0.04 | 0 |
| Klucel ® M | 0 | 0.04 |
| IB-05 | 0.31 | 0.31 |
| Mercapto-3-triazole | 0.09 | 0.09 |
| IR Dye #1 | 0.18 | 0.18 |
| Elvacite ® 4026 | 0 | 0.20 |
| Blue 63 | 0 | 0.20 |
| DHBP | 0 | 0.10 |
| Byk ® 336 | 0.40 | 0.41 |

TABLE III-continued

| Component | Example 3 (parts by weight) | Example 4 (parts by weight) |
|---|---|---|
| Phosmer PE | 0.07 | 0.07 |
| 1-Propanol | 44.03 | 44.14 |
| Water | 13.89 | 13.92 |
| 2-Butanone | 27.10 | 24.69 |

Samples of each resulting imageable element were treated under various conditions in order to accelerate the effects of ageing. In one test, the elements were wrapped in interleaving and paper-backed aluminum foil and then heat-treated for 5 days at 48° C. (dry test). Other elements were hung in a humidity chamber for 5 days at 38° C. and 80% relative humidity (humidity test). Still other elements were interleaved and wrapped in a black polyethylene sheet that was sealed with moisture proof packing tape. The sealed package was then placed in the humidity chamber for 5 days at 38° C., 80% relative humidity.

Imageable elements from each aging test were exposed at 200 mJ/cm$^2$ using a Creo® Trendsetter 3244x platesetter. The resulting imaged elements were then directly mounted onto an ABDick duplicator press charged with Van Son rubber-based black ink. The fountain solution was Varn 142W etch at 3 ounces per gallon (22.5 g/liter) and PAR alcohol replacement at 3 ounces per gallon (22.5 g/liter). The press was run for 400 impressions with each element.

Development of the imaged elements on-press was evaluated from the press sheets by evaluating the number sheets necessary to achieve a clean printing background. Typically, less than 100 sheets (for a clean printing background) are considered acceptable development for plates mounted on an ABDick duplicator press. TABLE IV below provides the development results for Examples 3 and 4.

TABLE IV

| Example | Substrate | No Treatment (fresh) | 5 days, 48° C. (dry test) | 5 days, 38° C., 80% RH (humidity test) | 5 days, 38° C., 80% RH (sealed bag) |
|---|---|---|---|---|---|
| 3 | PVPA | 50 | 75 | >>400 | 350 |
| 4 | PVPA | 50 | 75 | >>400 | 400 |

As can be seen from these results, the development rate improved when the plates were sealed in moisture proof wrapping.

The invention has been described in detail with particular reference to certain preferred embodiments thereof, but it will be understood that variations and modifications can be effected within the spirit and scope of the invention.

The invention claimed is:

1. A method for providing a negative-working single-layer imageable element comprising:
    A) providing a dried imageable layer formulation on a sulfuric acid-anodized aluminum substrate to form an imageable element,
    said dried imageable layer formulation comprising:
    a free radically polymerizable component,
    an initiator composition capable of generating radicals sufficient to initiate polymerization of said free radically polymerizable component upon exposure to imaging radiation,
    a radiation absorbing compound, and a polymeric binder comprising a polymer backbone to which are directly or indirectly linked poly(alkylene glycol) side chains, and B) enclosing said imageable element in a water-impermeable sheet material that substantially inhibits the transfer of moisture to and from said imageable element.

2. The method of claim 1 wherein said initiator composition comprises an onium salt, and optionally with a mercaptotriazole.

3. The method of claim 2 wherein said initiator composition comprises an iodonium salt, or an iodonium salt in combination with either a mercaptotriazole, wherein said iodonium salt is optionally a diaryliodonium tetraaryl borate.

4. The method of claim 1 wherein said polymeric binder comprises poly(ethylene glycol) or poly(propylene glycol) side chains and is present from about partially as discrete particles.

5. The method of claim 1 wherein said free radically polymerizable component comprises an unsaturated free-radical polymerizable monomer or oligomer, a free-radical crosslinkable polymer, or a combination thereof.

6. The method of claim 1 wherein said radiation absorbing compound is an infrared radiation absorbing compound.

7. The method of claim 1 wherein said imageable element is on-press developable and wherein said initiator composition comprises an iodonium salt with or without a mercaptotriazole.

8. The method of claim 1 wherein said imageable element is sensitive to imaging infrared radiation, said radiation absorbing compound is an IR dye, and said polymeric binder comprises poly(alkylene glycol) side chains, pendant cyano groups, or both poly(alkylene glycol) side chains and pendant cyano groups.

9. The method of claim 8 wherein said polymeric binder comprises poly(ethylene glycol) side chains that include from about 10 ethylene glycol units.

10. The method of claim 1 wherein said substrate is an electrochemically grained, sulfuric acid anodized aluminum substrate that has been treated after anodization with a phosphate solution that contains an inorganic fluoride.

11. The method of claim 1 wherein said dried imageable layer formulation further comprises a nonionic phosphate.

12. The method of claim 1 wherein said water-impermeable sheet material is a plastic film or metallic foil.

13. The method of claim 1 wherein said imageable element is enclosed in said water-impermeable sheet material while under a vacuum.

14. The method of claim 1 wherein said imageable element is wrapped with said water-impermeable sheet material that is sealed around the edges of said imageable element.

15. The method of claim 1 wherein said imageable element is substantially totally enclosed with said water-impermeable sheet material as one of from about 100 in a stack of the same imageable elements, which imageable elements are separated from each other with an interleaf paper.

16. The method of claim 1 wherein said imageable element is a lithographic printing plate.

17. The method of claim 1 further comprising:
C) imagewise exposing said imageable element provided by claim 1 to provide exposed and non-exposed regions in said imageable layer, and
D) developing said imagewise exposed element to remove only said non-exposed regions.

18. The method of claim 17 wherein said developing is carried out on-press with a fountain solution, printing ink, or a combination of both.

19. A method of making an imaged article comprising:
A) providing a negative-working single-layer imageable element by the method of claim 1,
B) imagewise exposing said imageable element at an imaging radiation to produce exposed and non-exposed regions in said imageable layer, and
C) without a preheat step, developing said imagewise exposed element to remove only said non-exposed regions.

20. The method of claim 19 wherein said developing is carried out on-press with a fountain solution, printing ink, or a combination thereof.

21. The method of claim 19 wherein both said imagewise exposing and developing are carried out on-press.

22. The method of claim 19 wherein said imaging radiation is at a wavelength of from about 700 nm and up to 1200 nm.

23. An imaged element obtained from the method of claim 19.

24. An enclosed imageable element obtained from the method of claim 1.

* * * * *